United States Patent [19]
Disney et al.

[11] Patent Number: 5,545,915
[45] Date of Patent: Aug. 13, 1996

[54] SEMICONDUCTOR DEVICE HAVING FIELD LIMITING RING AND A PROCESS THEREFOR

[75] Inventors: Donald R. Disney, Kokomo; Wayne A. Sozansky, Greentown; James M. Himelick, Kokomo, all of Ind.

[73] Assignee: Delco Electronics Corporation, Kokomo, Ind.

[21] Appl. No.: 376,566

[22] Filed: Jan. 23, 1995

[51] Int. Cl.⁶ .......................... H01L 23/58; H01L 29/76; H01L 29/94
[52] U.S. Cl. .......................... 257/491; 257/339; 257/341; 257/490; 257/494
[58] Field of Search .................................. 257/335, 337, 257/339, 341, 342, 488, 490, 491, 494, 495; 437/41

[56] References Cited

U.S. PATENT DOCUMENTS

| | | | |
|---|---|---|---|
| 4,853,345 | 8/1989 | Himelick | 437/41 |
| 5,381,031 | 1/1995 | Shibib | 257/339 |

FOREIGN PATENT DOCUMENTS

| | | | |
|---|---|---|---|
| 60-150674 | 8/1985 | Japan | 257/491 |
| 2-119184 | 5/1990 | Japan | 257/339 |
| 4-17372 | 1/1992 | Japan | 257/339 |

*Primary Examiner*—Steven H. Loke
*Attorney, Agent, or Firm*—Jimmy L. Funke

[57] ABSTRACT

A semiconductor device characterized by a field limiting ring formed by a number of field limiting cells that define wells which are laterally diffused to form a continuous equipotential ring between interior and exterior regions of a semiconductor device. A number of active cells are formed in the interior region, and are therefore delineated from the exterior region of the device. Each of these active cells is a transistor, and preferably a field-effect transistor, whose structure is essentially identical to the field limiting cells, except that their wells are not merged but instead are isolated from each other. The field limiting ring increases the breakdown voltage and the ruggedness of device, and therefore enables the device to sustain high voltages when the device is in the off-state. The process does not require masking, implanting and diffusion steps for the sole purpose of forming the field limiting ring, but is instead fully integrated with the semiconductor process for forming the active cells. The field limiting cells also contribute to forward current conduction when the device is in the on-state, thereby lowering the on-resistance of the device.

13 Claims, 3 Drawing Sheets

SEMICONDUCTOR DEVICE HAVING FIELD LIMITING RING AND A PROCESS THEREFOR

The present invention generally relates to semiconductor devices and their processing methods. More particularly, this invention relates to a process for forming a field limiting ring for a semiconductor device, and particularly a DMOS device, which is formed simultaneously with other structures of the device. As a result, the process eliminates the requirement for an additional masking and implanting step. In addition, the resulting field limiting ring is capable of contributing to electrical current conduction during the on-state of the device.

BACKGROUND OF THE INVENTION

As is known in the art, a double-diffused metal-oxide-semiconductor (DMOS) device is a type of field-effect transistor that is capable of controlling large voltages and currents at its source and drain terminals. The terminals of a DMOS device are typically formed by a substrate, a polysilicon layer, and a heavily doped island in the substrate, with dielectric layers being provided intermediate the substrate, polysilicon layer and island to electrically insulate these structures from each other. DMOS devices typically include thousands of identical "active" cells, each of which is formed by a well (e.g., a P-well) and an island (e.g., an N+ region within the P-well) beneath holes formed in the polysilicon layer and the dielectric layer between the polysilicon layer and the substrate. A metal layer over the device has projections that extend through each of the holes and contacts the N+ regions.

When a positive voltage is applied to the polysilicon layer (the gate terminal of the device), the surface of each P-well is inverted, creating a channel through which electrons can laterally flow from the N+ region (the source terminal of the device) to the substrate, and thereafter downward through the substrate to a drain terminal.

The ruggedness of a semiconductor device is generally defined as the ability of the device to resist failure when its breakdown voltage is exceeded. In order to increase the breakdown voltage and the ruggedness of DMOS devices, a continuous field limiting ring (FLR) may be formed near the perimeter of the device. Field limiting rings are generally composed of an implant of the same impurity type as the wells (e.g., a p-type implant) in the surface of the substrate, such that the implant forms an edge-termination structure that encircles the active cells. Because it is continuous, the field limiting ring serves to reduce the high electric fields that occur in the presence of sharp corners. As such, the field limiting ring enables the device to sustain high voltages when the device is in the off-state. To further increase the off-state voltage capability of the device, multiple field limiting rings can be employed to further alleviate electric field crowding in the edge termination area of the device.

While providing the above benefits, prior art field limiting rings and other related structures occupy a significant portion of the surface area of the device without contributing to forward current conduction when the device is in its on-state. Furthermore, conventional field limiting ring processes entail additional mask, implant and diffusion steps in order to introduce the continuous ring of impurity in the substrate. Accordingly, prior art processes for forming field limiting rings contribute additional costs and processing to the device.

The prior art has employed techniques for the purpose of integrating the field limiting ring masking and implant steps into the DMOS process. For example, the masking step used to form the p-type implant of the field limiting ring has been employed to define a P+ region in the N+ region of each active cell, so as to reduce the gain of the NPN transistor formed by each active cell. The assignee of the present invention has developed an alternative to forming P+ regions in the active cells for the purpose of reducing gain. The process involves a silicon etch which allows the source metallization to directly contact the P-well beneath the N+ region, such that the prior art mask, implant and diffusion steps necessary to form the P+ region are obviated. This process also eliminates the need for a mask to block the N+ implant from the centers of the cells. By eliminating these masking operations and their associated alignment tolerances, this process also allows for increased cell density. However, such a process does not provide for the formation of a field limiting ring around the active cells of the device of the type described in the prior art.

In view of the above, it would be desirable if a process were available by which a field limiting ring could be formed in a DMOS device which did not entail additional mask, implant and diffusion steps beyond those required to form the P-well and N+ regions of the device's active cells. Such a process would preferably result in a field limiting ring which optimizes use of the surface area of the device by contributing to the current conduction of the device in the on-state.

SUMMARY OF THE INVENTION

It is an object of this invention to provide a semiconductor device which is equipped with a field limiting ring that serves to increase the breakdown voltage and the ruggedness of the device.

It is a further object of this invention to provide a process for forming such a field limiting ring, in which the process does not entail additional masking, implanting or diffusion steps beyond those required to form the source, gate and drain regions of the device.

It is another object of this invention that such a field limiting ring serve to optimize use of the surface area of the device by contributing to the current conduction of the device in the on-state.

In accordance with a preferred embodiment of this invention, these and other objects and advantages are accomplished as follows.

According to the present invention, there is provided a semiconductor device which includes a substrate, a dielectric layer on the substrate, and a polysilicon layer on the dielectric layer so as to be electrically insulated from the substrate. A plurality of field limiting cells are formed in the substrate, with the field limiting cells being aligned to form a continuous field limiting ring which delineates an interior region and an exterior region on the surface of the semiconductor device.

Each field limiting cell is characterized by an opening through the dielectric and polysilicon layers, a well of a first dopant type in the substrate beneath the opening, and an island of a second dopant type in the well. Each well electrically isolates its corresponding island from other islands and from the substrate. As a result of the proximity of the openings, the polysilicon layer forms a bridge between each adjacent pair of openings, the number of bridges formed on the device being dependent on the number of field limiting cells. The bridges serve to interconnect the interior region and the exterior region of the device. In accordance with this invention, each well is diffused to extend laterally beneath each of its adjacent bridges so as to merge with the wells of the adjacent field limiting cells, thereby forming the continuous field limiting ring in the substrate of the semiconductor device. Finally, a source metallization is provided having portions which project through the openings and into the islands and wells in the substrate, while being electrically isolated from the polysilicon layer. As such, the source metallization electrically contacts each of the islands and wells.

As described above, the semiconductor device of this invention is characterized by a field limiting ring formed by a number of wells which, when laterally diffused, merge to form a continuous barrier between interior and exterior regions of a semiconductor device. In the context of the DMOS device, the substrate forms the drain terminal of the semiconductor device, and the polysilicon layer forms the gate terminal of the device. A number of active cells are formed in the interior region, and are therefore electrically isolated from the exterior region of the device, in which the edges and corners of the device chip are located. Each of these active cells is a transistor, and preferably a field-effect transistor (FET) whose structure is essentially identical to the field limiting cells, except that their wells are not merged but instead are isolated from each other. Furthermore, the source metallization that contacts the islands of the field limiting cells also electrically contacts each of the islands of the active cells. The islands of the active cells serve as the source terminal of the device such that, when a positive voltage is applied to the polysilicon layer (the gate terminal of the device), the surface of each of the wells is inverted, creating a channel through which electrons (or holes) can laterally flow from the islands (the source terminal of the device) to the substrate, and thereafter downward through the substrate to the drain terminal.

Because the field limiting ring circumscribes the active cells in the device, it eliminates spherical junctions associated with the use of sharp mask corners, which would otherwise cause high electric field peaks in the corners of the device. As such, the field limiting ring increases the breakdown voltage and the ruggedness of device. Because the field limiting cells are configured similarly to the active cells and contacted by the source metallization, the field limiting cells are "active" during the on-state. As a result, the field limiting cells are configured to improve the on-state performance of the device by contributing to the forward current conduction through the device.

In addition to the operational advantages of the semiconductor device of this invention, another significant advantage of this invention is that the process does not require masking, implanting and diffusion steps for the sole purpose of forming the field limiting ring. Specifically, because each of the active cells are structured essentially identically to the field limiting cells, except that their wells are not merged, the openings, wells and islands of the field limiting cells can be formed simultaneously with the corresponding features of the active cells. As a result, the process of this invention can be performed at a lower cost than prior art processes employed to form field limiting rings.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

Figure 1:
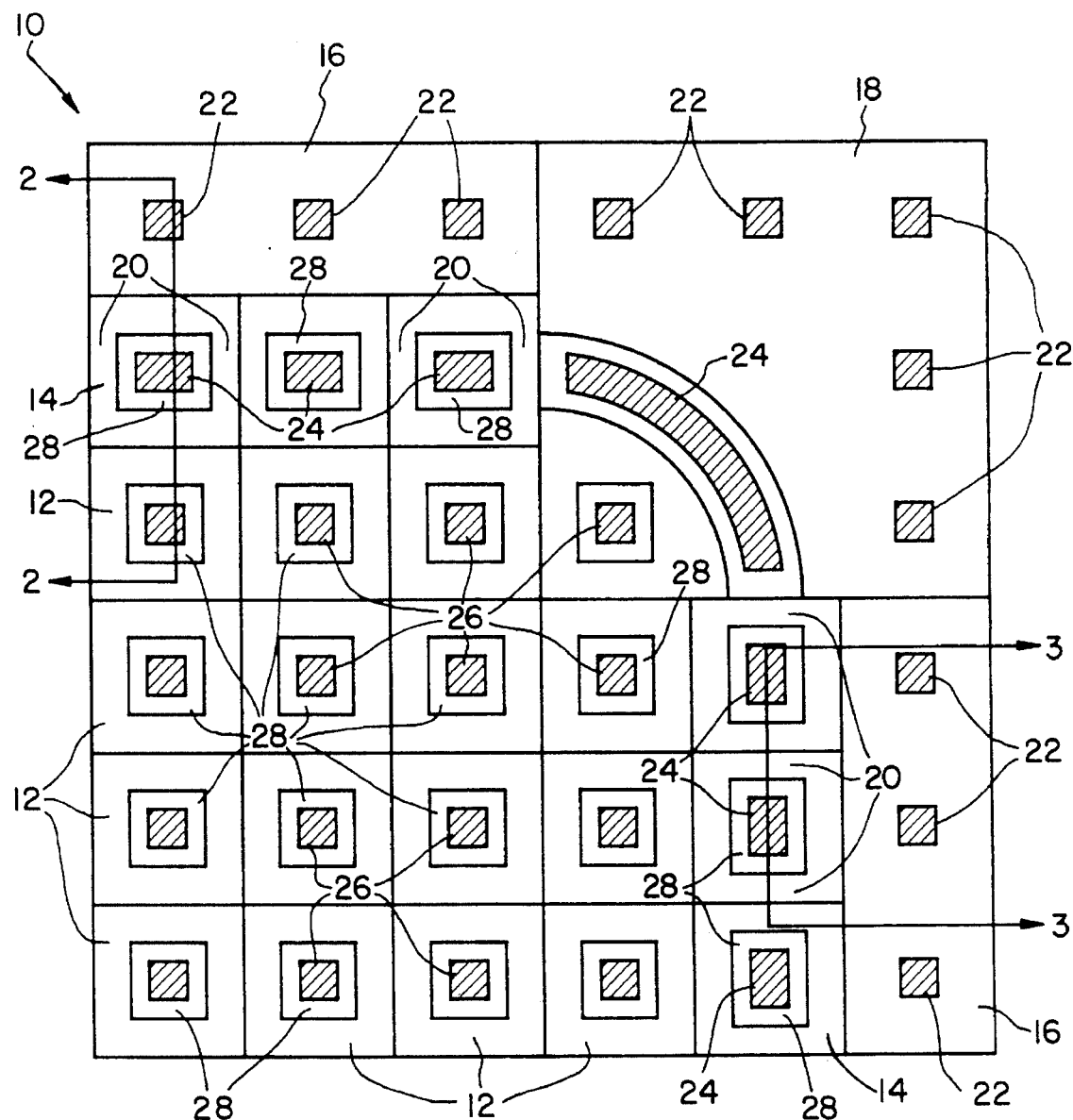
FIG. 1 is a plan view of a corner of a DMOS device in accordance with a first embodiment of the invention, with upper layers of the device being omitted to illustrate field limiting, gate contact and active cells of the device.
Figure 2:
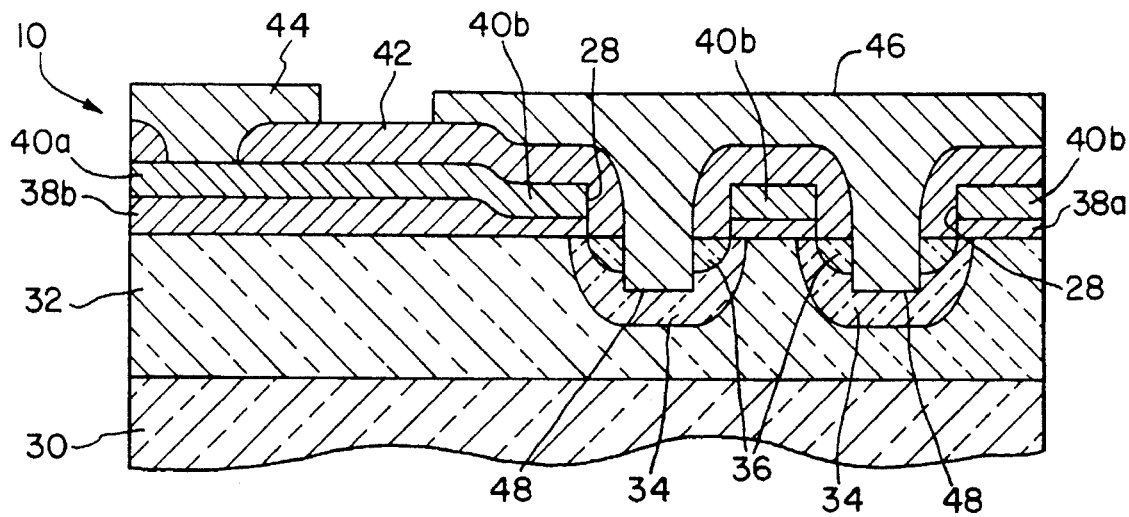
FIG. 2 is a cross sectional view of the device of FIG. 1 along line 2—2, with the upper layers of the device being included to more fully illustrate the invention.
Figure 3:
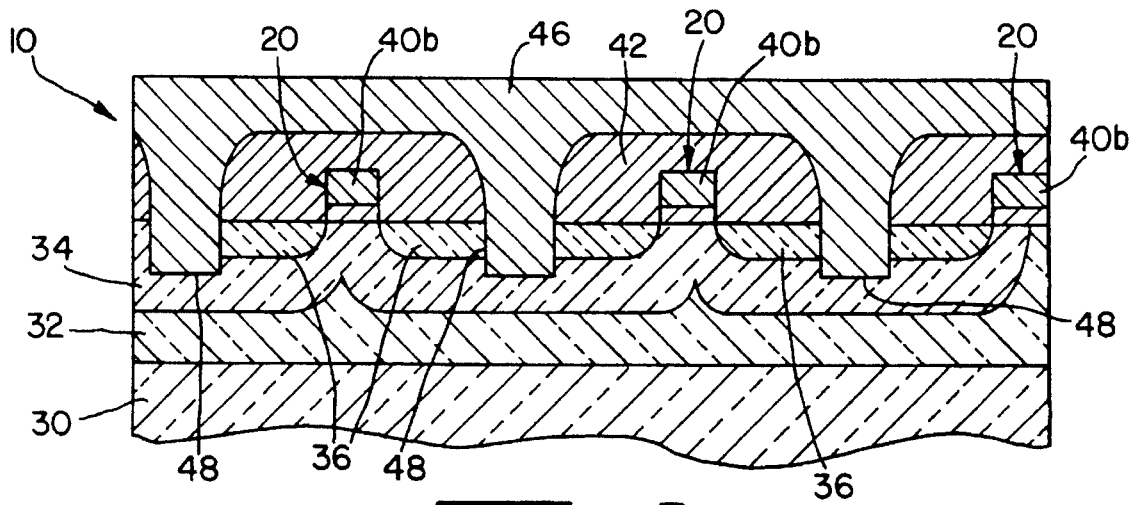
FIG. 3 is a cross sectional view of the device of FIG. 1 along line 3—3, with the upper layers of the device being included more fully illustrate the invention.

Illustrated in FIGS. 1 through 3 is a corner of a DMOS device 10 in accordance with a first embodiment of this invention. As illustrated, the device 10 is equipped with a field limiting ring defined by an array of field limiting cells 14. The field limiting ring completely circumscribes a number of "active" cells 12 located in an interior region of the surface of the device 10. As used herein, the term "active cell" is intended to denote a transistor device, and to distinguish these cells from the field limiting cells 14. In the context of a DMOS device, the active cells 12 are metal-oxide-semiconductor field-effect transistors (MOSFET). While the primary function of the field limiting cells 14 is to form an isolating barrier between the active cells 12 and the perimeter of the device 10, it will become apparent that the field limiting cells 14 also contribute to the forward current conduction in the device 10, and are therefore are also "active" in this respect.

As seen in FIG. 1, which represents a corner of the device 10, gate contact cells 16 are provided along the edges of the device 10 and corner cells 18 are located in the corners of the device 10. A single field limiting cell having a relatively large radius extends arcuately through the corner cell 18 shown in FIG. 1. The active, field limiting, gate contact and corner cells 12, 14, 16 and 18 are illustrated with upper layers (a dielectric layer 42 and metallization layers 44 and 46 of FIGS. 2 and 3) omitted to illustrate the cells and their construction. The surface seen in the plan view of FIG. 1 is primarily a polysilicon layer 40. Numerous openings 28 are formed in the polysilicon layer 40, exposing an underlying substrate (an epitaxial layer 32 of FIGS. 2 and 3). The openings 28 also form bridges 20 between each pair of adjacent field limiting cells 14. The bridges 20 serve to electrically interconnect the active cells 12 within the interior region of the device 10 with the gate contact cells 16 in the exterior region of the device 10. As such, the bridges 20 serve to bring the gate signal from the gate contact cells 16 to the active cells 12. The bridges 20 are a critical feature of this invention, in that their widths must be controlled in order to enable the creation of the field limiting ring of the invention, as will be explained below.

Centrally located in the openings 28 of the active cells 12 are source contacts 26, and centrally located in the openings 28 of the field limiting cells 14 are source contacts 24. Gate contacts 22 are shown within each of the gate contact cells 16 through which electrical contact is made with the polysilicon layer 40. As is conventional, the contacts 22 and 26 enable electrical contact with the gate and source terminals of the device 10, respectively. Unique to the present invention, the contacts 24 enable the field limiting cells 14 to contribute to the current conduction through the device 10 in the on-state, as will also be explained below.

FIG. 2 illustrates in cross-section, from left to right, a gate contact cell 16, a field limiting cell 14 and an active cell 12 of the device 10. FIG. 2 further illustrates the device 10 as being formed on a substrate 30 on which the epitaxial layer 32 is grown by any suitable method. In the context of the n-channel DMOS device 10 shown, the substrate 30 is heavily doped n-type, enabling the substrate 30 to serve as a drain terminal for the device 10. The epitaxial layer 32 is lightly-doped n-type. A first dielectric layer 38, such as silicon dioxide, is formed over the surface of the epitaxial layer 32. A thin layer of gate oxide 38a is formed over the active cells 12, while a thicker layer of field oxide 38b may be formed around the device periphery. This is followed by the formation of the polysilicon layer 40, illustrated in FIG. 2 as being composed of two tiers 40a and 40b, thereby forming a two tier polysilicon field plate. A first tier 40b is located above the gate oxide 38a. In the on-state, the first tier 40b provides for the formation of a channel at the surface of an underlying p-well region 34. In the off-state, the first tier 40b provides a field-plate over the edge of the p-well diffusion, which serves to reduce the electric field in this area and thus increases the breakdown voltage of the device 10. The second tier 40a of the polysilicon layer 40 provides further electric field reduction, thereby further increasing the breakdown voltage of the device 10.

In addition, the first tier 40b forms the bridges 20 between each adjacent pair of field limiting cells 14 and the gates for each of the active cells 12. As can be seen from FIG. 1, each of the gates has a width which is larger than the widths of the bridges 20.

The openings 28 in the polysilicon layer 40 are shown in FIG. 2 as extending through the dielectric layer 38 to the epitaxial layer 32. Located beneath each opening 28 and within the epitaxial layer 32 is an N+ source region 36 within a P-well 34. As is conventional, the wells 34 and source regions 36 are formed by ion implantation through the openings 28, with the wells 34 being laterally diffused to extend beneath the adjacent portions of the polysilicon layer 40. As such, the wells 34 of the field limiting cells 14 diffuse laterally beneath their bridges 20. The openings 28 are subsequently filled by a second dielectric layer 42, such as a low temperature oxide (LTO), which overlays the polysilicon layer 40. Openings are then formed in the second dielectric layer 42 through which the contacts 22, 24 and 26 are formed by a gate metallization 44 and a source metallization 46. Notably, the source metallization 46 includes projections 48 which extend into the epitaxial layer 32, thus directly contacting the wells 34 and source regions 36 of the active and field limiting cells 12 and 14. This feature reduces the gain of the NPN transistor formed by each of the active cells 12.

The structure portrayed in FIG. 2 illustrates the operation of the device 10. In the on-state, a positive voltage is applied to the polysilicon layer 40 through the gate contact 22 formed by the metallization 44, such that the first tier 40b of the polysilicon layer 40 acts as a gate over the P-well 34 of each active and field limiting cell 12 and 14. As a result, the surface of each P-well 34 is inverted, creating a channel in the P-well 34 through which electrons can laterally flow from the N+ source region 36 (the source terminal of the device 10) to the epitaxial layer 32, and thereafter downward through the epitaxial layer 32 to a drain terminal formed by the substrate 30.

In view of the above, it can be appreciated that each of the field limiting cells 14 are electrically connected to the source metallization 46, such that the field limiting cells 14 are active during the on-state and can therefore contribute to forward current conduction when the device 10 is in the on-state. As a result, the field limiting ring of the present invention makes more efficient use of the surface area of the device 10.

FIG. 3 illustrates a row of field limiting cells 14, and therefore a segment of the field limiting ring of this invention. As shown in FIG. 3, the field limiting ring is formed by the merger of the P-wells 34 of the field limiting cells 14. In this manner, the P-wells 34 form a continuous equipotential ring that prevents the high electric fields that can be present when such a ring is interrupted or forms a sharp corner. For the same reason, the field limiting ring is continuous through the corner cell 18 and maintains a large radius of curvature.

In order to assure that the wells 34 of the field limiting cells 14 will merge, the widths of the bridges 20 between each adjacent pair of field limiting cells 14 must be carefully sized. In practice, limiting the width of each bridge 20 to be not more than about 1.6 times greater than the final juncture depth of each adjacent well 34 enables adjacent wells 34 to merge beneath their shared bridge 20 during diffusion of the wells 34. Openings 28 having a dimension aligned with the field limiting ring of about sixteen micrometers and bridges 20 having a width of about four micrometers have been found to achieve the desired results of this invention. In this scenario, a well junction depth of about 2.5 micrometers would be required to obtain a lateral diffusion of about two micrometers for each of the wells 34 of the field limiting cells 14.

In accordance with this invention, the above structure is achieved by a process which completely eliminates the requirement for separate masking, implanting and diffusion steps for forming the field limiting ring. Specifically, each of the openings 28 are formed simultaneously through the dielectric and polysilicon layers 38 and 40. The openings 28 corresponding to the field limiting cells 14 are aligned so as to form the bridges 20 and locate the field limiting ring. The openings 28 corresponding to the active cells 12 are disposed within the interior region, with the polysilicon layer 40 forming a gate terminal between each adjacent pair of these openings 28.

The wells 34 for both the active and field limiting cells 12 and 14 are then simultaneously formed by an implant technique through each of the openings 28 and a subsequent diffusion. In this manner, the implants are self-aligned by the openings 28, as is conventional with DMOS devices. During diffusion, each pair of wells 34 separated by a bridge 20 diffuse together to form the continuous, equipotential field limiting ring, while the wells 34 of the active cells 12 remain isolated from the wells 34 of their adjacent active cells 12. The N+ source regions 36 are then implanted through each of the openings 28 and diffused, followed by deposition and etching of the second dielectric layer 42 and the metallization 44 and 46.

Figure 5:
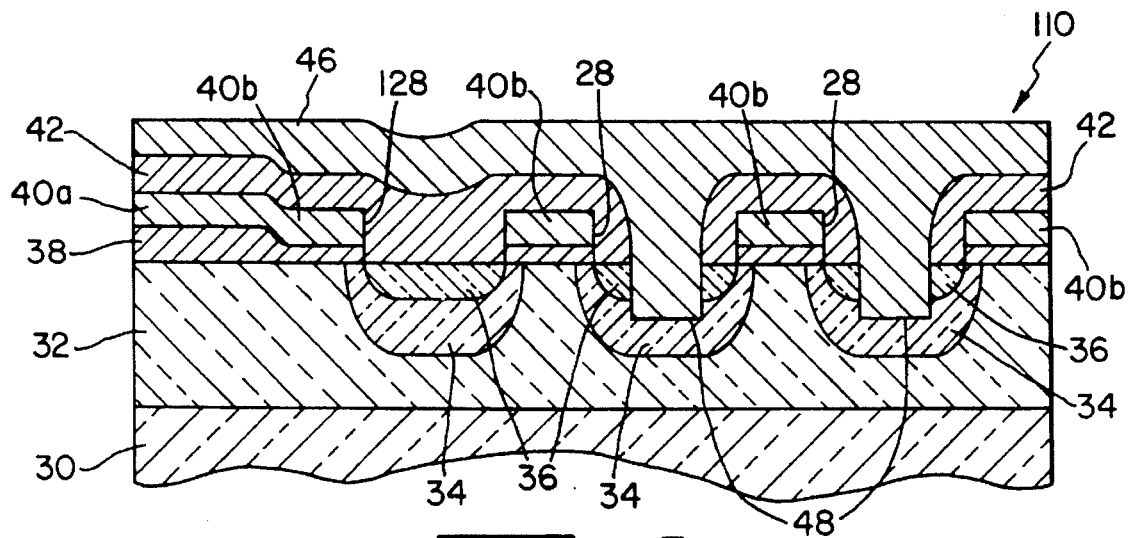
FIG. 5 is a cross sectional view of the device of FIG. 4 along line 5—5, with the upper layers of the device being included to more fully illustrate the invention.
Figure 4:
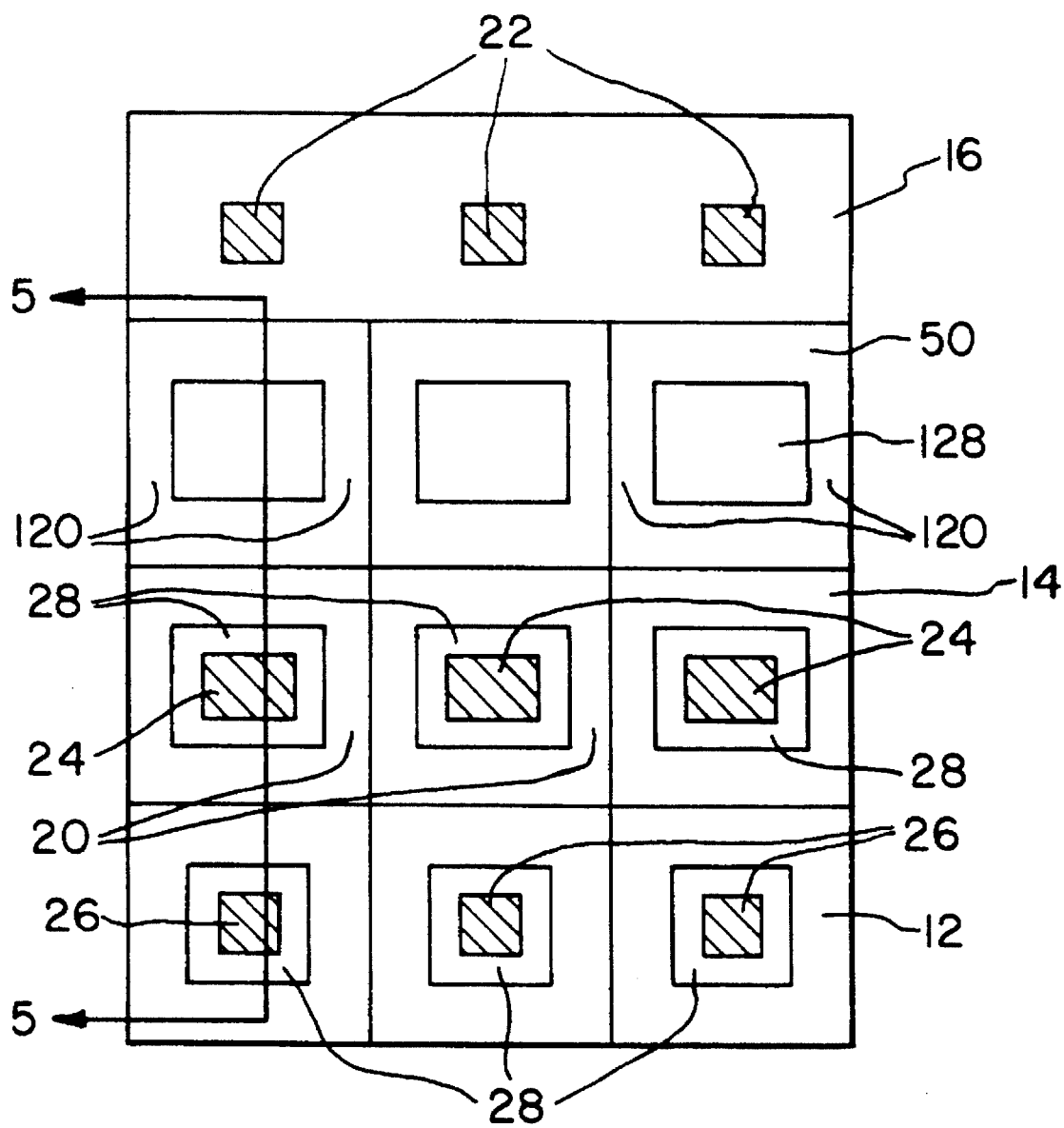
FIG. 4 is a plan view of an edge of a DMOS device in accordance with a second embodiment of the invention, with upper layers of the device being omitted to illustrate the gate contact and active cells of the device, as well as two distinct arrays of field limiting cells.

A second embodiment of the present invention is illustrated in FIGS. 4 and 5, which illustrate a DMOS device 110 employing a second field limiting ring. The second field limiting ring is composed of a number of field limiting cells 50. In contrast to the field limiting cells 14 of the first field limiting ring, the field limiting cells 50 are not electrically connected to the source metallization 46. This configuration is shown in FIG. 5, which illustrates in cross-section, from left to right, a field limiting cell 50, a field limiting cell 14 and an active cell 12 of the device 110 of FIG. 4.

As with the field limiting cells 14, the field limiting cells 50 are delineated by bridges 120 formed by openings 128 in the first tier 40b of the polysilicon layer 40. As before, P-wells 34 formed beneath the openings 128 are diffused together to form a continuous equipotential ring. Accordingly, the bridges 120 must be narrow enough to allow the wells 34 of the field limiting cells 50 to merge. As is apparent from FIG. 5, the field limiting cells 50 are formed simultaneously with the active and field limiting cells 12 and 14, and their P-wells 34 are isolated from the P-wells 34 of the field limiting cells 14 that form the first field limiting ring. The device 110 can be provided with multiple field limiting rings, each of which can be formed in accordance with the above as a fully integrated step of the DMOS process. In the off-state, each successive ring serves to further reduce the electric field and thereby increase the breakdown voltage of the device 110. However, because the field limiting cells 50 are not electrically connected to the source metallization 46, these cells 50 are not capable of contributing to forward current conduction when the device 110 is in the on-state.

From the above, it can be seen that a significant advantage of the present invention is that a semiconductor device can be provided with a field limiting ring whose process is fully integrated with the formation of the active cells of the device. The field limiting ring is formed by a number of field limiting cells whose wells are laterally diffused to form a continuous equipotential ring between interior and exterior regions of the device. Advantageously, the field limiting cells of this invention are configured to conduct current during the on-state, and are therefore able to improve the on-state performance and area efficiency of the device.

Another advantage of this invention is that the process does not require masking, implanting and diffusion steps for the sole purpose of forming one or more field limiting rings. As a result, the process of this invention can be performed at a lower cost than prior art processes which require separate masking, implanting and/or diffusing steps to form a field limiting ring.

While our invention has been described in terms of a preferred embodiment, it is apparent that other forms could be adopted by one skilled in the art for example, by modifying the layout of the gate contact, field limiting and active cells, using alternative materials to form the device, and forming other types of active devices. Accordingly, the scope of our invention is to be limited only by the following claims.

The embodiments of the invention in which an exclusive property or privilege is claimed are defined as follows:

1. A semiconductor device comprising:
    a substrate;
    a dielectric layer on a surface of the substrate;
    a polysilicon layer on the dielectric layer so as to be electrically isolated from the substrate;
    a first plurality of cells within an interior region of the surface of the semiconductor device, each of the first plurality of cells comprising a transistor having a source, a gate electrode formed by the polysilicon layer, and a drain formed by the substrate;
    a second plurality of cells aligned on the substrate so as to circumscribe the first plurality of cells, thereby segregating the interior region from an exterior region on the surface of the substrate, each of the second plurality of cells comprising:
    an opening extending through the dielectric and polysilicon layers to the surface of the substrate, the polysilicon layer forming a bridge between each adjacent pair of openings so as to interconnect the interior region and the exterior region, each bridge having a width;
    a well of a first dopant type in the substrate beneath the opening, the well having a depth as measured from the surface of the substrate, the well laterally extending beneath each adjacent bridge so as to merge with the well of each adjacent cell of the second plurality of cells, such that the wells of the second plurality of cells form a continuous field limiting ring in the substrate of the semiconductor device; and
    an island of a second dopant type in the well;
    a gate contact in the exterior region of the semiconductor device and electrically interconnected with the polysilicon layer; and
    a metallization layer having portions projecting through the openings and into the island and well of each of the second plurality of cells, the metallization layer being in electrical contact with the island of each of the second plurality of cells, the metallization layer being electrically isolated from the polysilicon layer;
    wherein the second plurality of cells contribute to the current conduction of the semiconductor device in the on-state.

2. A semiconductor device as recited in claim 1 wherein the semiconductor device is a DMOS device.

3. A semiconductor device as recited in claim 1 wherein the substrate includes an epitaxial layer, the epitaxial layer and the drain being of the second dopant type.

4. A semiconductor device as recited in claim 1 wherein each of the first plurality of cells comprises:
    the drain formed by the substrate;
    the gate formed by the polysilicon layer;
    the dielectric layer intermediate the substrate and the polysilicon layer;
    a second opening extending through the dielectric and polysilicon layers to the surface of the substrate;
    a well of the first dopant type in the substrate beneath the second opening, the well being isolated from the wells of adjacent cells of the first plurality of cells; and
    an island of the second dopant type in the well, the well electrically isolating the island from the substrate;
    wherein the metallization layer extends through the second opening in the polysilicon and dielectric layers and into the island and the well, such that the metallization is in electrical contact with the island so as to establish the island as a source region of the semiconductor device.

5. A semiconductor device as recited in claim 4 wherein the polysilicon layer forms a two tier polysilicon field plate comprising a first portion within each of the second plurality of cells, and a second portion in the exterior region of the semiconductor device, the dielectric layer being thicker under the second portion than under the first portion such that the first portion is spaced closer to the substrate than the second portion.

6. A semiconductor device as recited in claim 1 wherein the first dopant type is a p-type dopant and the second dopant type is an n-type dopant.

7. A semiconductor device as recited in claim 1 wherein the width of each of the bridges is not more than about 1.6 times greater than the depth of each adjacent well as measured from the surface of the substrate.

8. A semiconductor device as recited in claim 1 wherein the field limiting ring is a first field limiting ring of the semiconductor device, the semiconductor device further comprising a second continuous field limiting ring circumscribing the first field limiting ring, the second continuous field limiting ring comprising a third plurality of cells in the exterior region, each of the third plurality of cells comprising:

the substrate;

a second opening extending through the dielectric and polysilicon layers to the surface of the substrate; and a well of the first dopant type in the substrate beneath the second opening, the well laterally extending so as to merge with the well of each adjacent cell of the third plurality of cells, such that the wells of the third plurality of cells form the second continuous field limiting ring in the substrate of the semiconductor device, the wells of the third plurality of cells being isolated from the wells of the second plurality of cells.

9. A DMOS semiconductor device comprising:

a substrate comprising an n-doped epitaxial layer overlaying a more heavily n-doped layer which forms a drain terminal of the DMOS semiconductor device;

a dielectric layer on a surface of the epitaxial layer;

a polysilicon layer on the dielectric layer so as to be electrically isolated from the substrate, the polysilicon layer forming a gate electrode of the DMOS semiconductor device;

a field limiting ring formed in the epitaxial layer so as to define an interior region and an exterior region on the surface of the epitaxial layer;

a plurality of active cells within the interior region; and a metallization layer overlaying the polysilicon layer, the metallization layer being electrically isolated from the polysilicon layer;

wherein the field limiting ring comprises a first plurality of field limiting cells, each of the first plurality of field limiting cells comprising:

a first opening extending through the dielectric and polysilicon layers to the surface of the epitaxial layer, the polysilicon layer forming a bridge between each adjacent pair of the first openings so as to interconnect the interior region and the exterior region, each bridge having a width;

a p-type doped well in the epitaxial layer beneath the first opening, the well having a depth as measured from the surface of the epitaxial layer, the well extending laterally beneath each adjacent bridge so as to merge with the well of each adjacent field limiting cell of the first plurality of field limiting cells, such that the wells of the first plurality of field limiting cells form the field limiting ring in the epitaxial layer;

an n-type doped island in the well, the well electrically isolating the island from other islands of the first plurality of field limiting cells and from the substrate; and the metallization layer having portions projecting through the first openings and into the island and well of each of the first plurality of field limiting cells, such that the first plurality of field limiting cells contribute to the current conduction of the DMOS semiconductor device in the on-state; and wherein each of the plurality of active cells within the interior region comprises:

the drain terminal defined by the substrate;

the gate electrode defined by the polysilicon layer;

the dielectric layer intermediate the substrate and the polysilicon layer;

a second opening through the dielectric and polysilicon layers to the surface of the epitaxial layer;

a p-type doped well in the epitaxial layer beneath the second opening, the well being isolated from the wells of adjacent cells of the plurality of active cells within the interior region;

an n-type doped island in the well; and wherein a portion of the metallization layer extends through the second opening in the polysilicon and dielectric layers and into the island and the well of each of the plurality of active cells, such that the metallization layer is in electrical contact with the island of each of the plurality of active cells so as to establish the islands of the plurality of active cells as source regions of the DMOS semiconductor device.

10. A DMOS semiconductor device as recited in claim 9 wherein the polysilicon layer forms a two tier polysilicon field plate comprising a first portion within each of the first plurality of field limiting cells, and a second portion in the exterior region of the DMOS semiconductor device, the dielectric layer being thicker under the second portion than under the first portion such that the first portion is spaced closer to the epitaxial layer than the second portion.

11. A DMOS semiconductor device as recited in claim 9 wherein the width of each bridge of the first plurality of field limiting cells is not more than about 1.6 times greater than the depth of each adjacent well as measured from the surface of the epitaxial layer.

12. A DMOS semiconductor device as recited in claim 9 wherein the field limiting ring is a first field limiting ring of the semiconductor device, the semiconductor device further comprising a second continuous field limiting ring circumscribing the first field limiting ring, the second continuous field limiting ring comprising a second plurality of field limiting cells in the exterior region, each of the second plurality of field limiting cells comprising:

the substrate;

a third opening extending through the dielectric and polysilicon layers to the epitaxial layer; and a p-type doped well in the epitaxial layer beneath the third opening, the well of each of the second plurality of field limiting cells extending laterally so as to merge with the well of each adjacent field limiting cell of the second plurality of field limiting cells, such that the wells of the second plurality of field limiting cells form the second continuous field limiting ring in the epitaxial layer of the DMOS semiconductor device, the wells of the second plurality of field limiting cells being isolated from the wells of the first plurality of field limiting cells.

13. A DMOS semiconductor device as recited in claim 9 further comprising a plurality of gate contact cells within the exterior region, the plurality of gate contact cells being separated from the plurality of active cells by the field limiting ring, each of the plurality of gate contact cells having a contact which is electrically connected to the polysilicon layer.

* * * * *